United States Patent [19]

Horvitz et al.

[11] Patent Number: 4,922,132
[45] Date of Patent: May 1, 1990

[54] RADIO FREQUENCY ENERGY DETECTION CIRCUITRY

[75] Inventors: Charles S. Horvitz, Westwood; Michael L. Miceli, Hingham, both of Mass.

[73] Assignee: Raytheon Company, Lexington, Mass.

[21] Appl. No.: 317,398

[22] Filed: Mar. 1, 1989

[51] Int. Cl.$^5$ .................. H03K 5/153; H03K 5/24
[52] U.S. Cl. ................... 307/359; 307/310; 307/354; 307/362; 455/214
[58] Field of Search ............. 307/290, 310, 315, 354, 307/359, 362; 455/214

[56] References Cited

U.S. PATENT DOCUMENTS 3,965,371 6/1976 Sato et al. ..................... 307/359
4,185,251 1/1980 Brown, Jr. et al. .

OTHER PUBLICATIONS

Malmstadt et al., "Linear and Nonlinear Op Amp Applications (Chapter 8)", Electronics and Instrumentation for Scientists (1981), pp. 195–199.

Primary Examiner—John Zazworsky
Attorney, Agent, or Firm—Denis G. Maloney; Richard M. Sharkansky

[57] ABSTRACT

Radio frequency energy detection circuitry for changing the logic state of an output signal from an initial state to a second state in response to received radio frequency energy exceeding a first predetermined power level, such circuitry being non-responsive to fades in such received radio frequency signal by preventing the second state of the output signal from reverting to the initial state until the power level of the received radio frequency energy falls below a second, lower predetermined power level.

4 Claims, 2 Drawing Sheets

RADIO FREQUENCY ENERGY DETECTION CIRCUITRY

The Government has rights in this invention pursuant to Contract No. F08635-83-C-0105 awarded by the Department of the Air Force.

BACKGROUND OF THE INVENTION

This invention relates generally to radio frequency energy detection circuitry and more particularly to circuitry of such type which is adapted to respond to the detection of radio frequency energy but which is non-responsive to small fades in the power level of the radio frequency energy under detection.

As is known in the art, it is frequently required to provide radio frequency energy detection circuitry. Such circuitry typically includes a diode detector to, in effect, rectify received radio frequency energy and thereby produce a detected signal representing the power in the received radio frequency energy. The output of the diode detector is sometimes fed to a first input of a comparator, the second input of the comparator being fed by a signal representative of a threshold level. In the absence of the received radio frequency energy, the output of the comparator is at an initial state; however, when radio frequency energy is received having a power level greater than that represented by the threshold level, the threshold level at the second input of the comparator is exceeded, thereby changing the logic state at the output of the comparator from the initial state to a second state. When the received radio frequency energy terminates, the level at the first input of the comparator falls below the threshold level returning the output state of the comparator to its initial state.

While such arrangement is adequate for many applications, in some applications the received radio frequency energy may momentarily fade to a level below that corresponding to the threshold level at the second input of the comparator, thereby changing the output state of the comparator from the second state back to the initial state. In some applications, however, it may be undesirable for the circuitry to respond to these momentary fades but rather it is desirable that the circuitry continue to indicate the presence of received radio frequency energy and thus prevent the detection circuitry from responding to these false losses of radio frequency energy indications.

SUMMARY OF THE INVENTION

It is therefore an object of this invention to provide an improved radio frequency energy detection circuit.

It is another object of the invention to provide a radio frequency energy detection circuit which will be non-responsive to momentary fades in received radio frequency energy.

It is a further object of this invention to provide an improved radio frequency energy detection circuit wherein a diode detector and a threshold signal source are coupled to inputs of a comparator and wherein circuitry is provided to accurately control the threshold level signal fed to such comparator so that the detection circuitry may be accurately rendered non-responsive to momentary fades in received radio frequency energy.

These and other objects of the invention are obtained generally by providing a radio frequency energy detection circuitry for changing the logic state of an output signal from an initial state to a second state in response to received radio frequency energy exceeding a first predetermined power level, such circuitry being non-responsive to fades in such received radio frequency signal by preventing the second state of the output signal from reverting to the initial state until the power level of the received radio frequency energy falls below a second, lower predetermined power level, such circuitry comprising: means, including a diode detector fed by the received radio frequency energy, for producing an output voltage across the diode, such output voltage varying in accordance with the power of the received radio frequency energy, the voltage produced across the diode detector also varying with temperature variations over a predetermined operating range of temperatures; means for producing a nominal threshold voltage having a level representative of the first predetermined power level including temperature compensating circuitry means, in thermal communication with the diode detector, for varying the nominal threshold voltage level in accordance with the temperature produced variations in the voltage across the diode detector; and, means, including: (i) a comparator having a pair of inputs and an output, a first one of the inputs being coupled to the diode detector; and, (ii) a feedback resistor, coupled between the output of the comparator and a second one of the pair of inputs of the comparator, for producing at the output of the comparator the output signal having the initial state in the absence of received radio frequency energy and for changing the initial state to the second state in response to the received radio frequency energy exceeding the first predetermined power level, the second state of the output signal being combined with the temperature compensation threshold level produced by the temperature compensating circuit to reduce the voltage at the second one of the pair of inputs of the comparator to the lower threshold voltage representative of the second, lower, predetermined power level to prevent the second state of the output signal from reverting to the initial state until the power level of the received radio frequency energy falls below the second, lower predetermined power level.

With such arrangement, because the output of the diode detector is a function of temperature and such is temperature compensated, an accurate threshold voltage is produced to thereby provide an accurate reference from which is subtracted a voltage fed to it via the feedback resistor.

BRIEF DESCRIPTION OF THE DRAWINGS

For a more complete understanding of the concepts of this invention, reference is now made to the following description taken together in conjunction with the accompanying drawings, in which.

DESCRIPTION OF THE PREFERRED EMBODIMENTS

Figure 1:
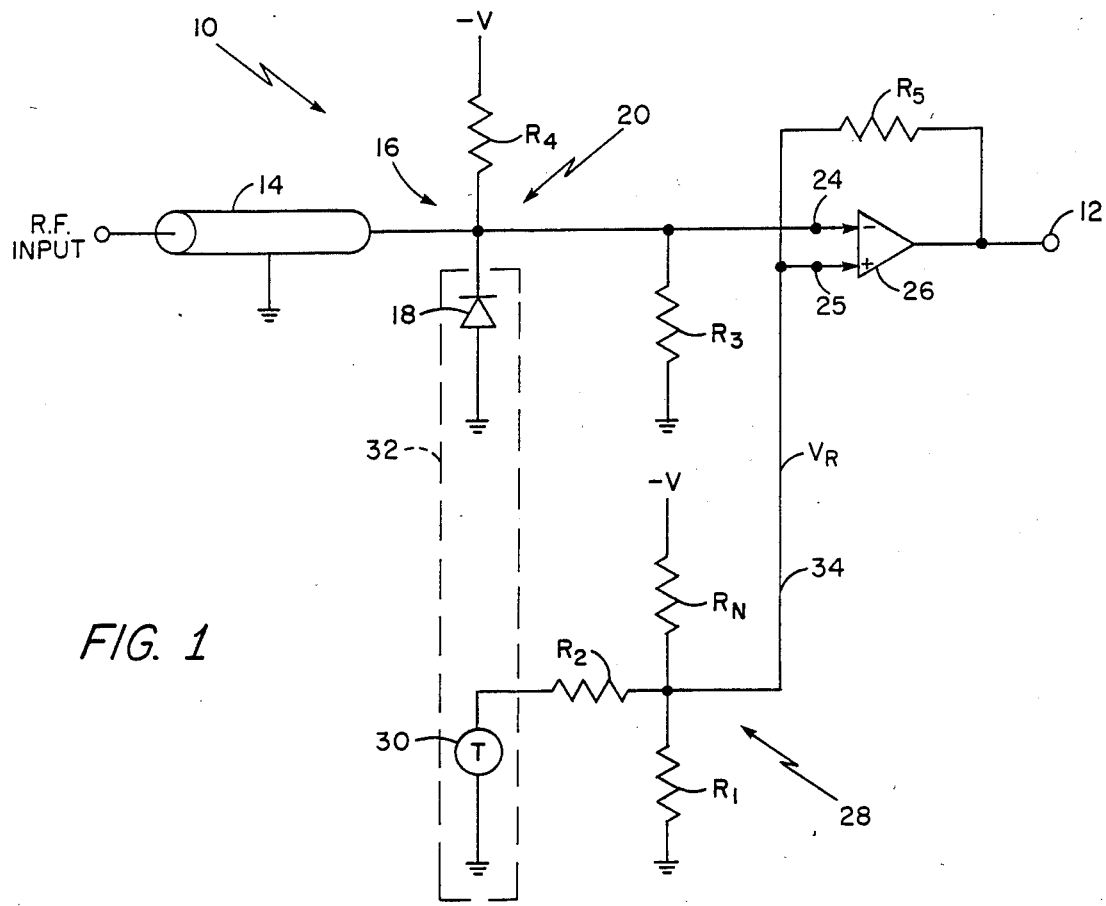
FIG. 1 is a schematic diagram of a radio frequency energy detection circuit according to the invention.

Referring now to FIG. 1, a radio frequency detection circuit 10 is shown for changing the logic state of an output signal at output terminal 12 from an initial state, here a "high" positive voltage (or logic 1 state) to a second state, here a "low" voltage (or logic 0 state) in response to radio frequency energy received by such circuit 10 via input transmission line 14, when the radio frequency power fed to such circuit 10 via line 14 exceeds a first, relatively high, predetermined power level, $P_1$. The circuit 10 is non-responsive to small fades in such received radio frequency signal by preventing the second state of the output signal at terminal 12 from reverting to the initial state until the power level of the received radio frequency energy falls below a second, relatively low, predetermined power level, $P_2$.

Figure 2:
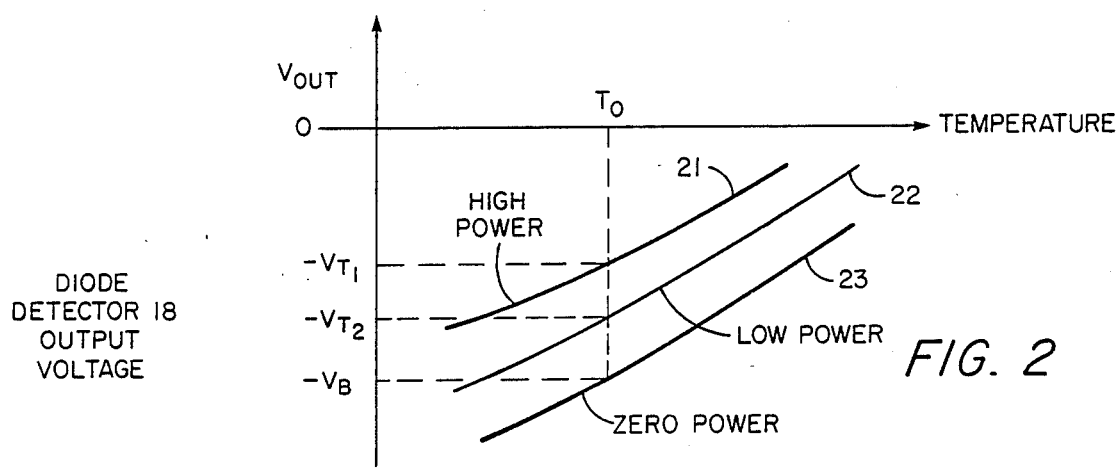
FIG. 2 are curves showing the relationship between temperature and the output of a diode detector used in the circuitry of FIG. 1 in response to both a low and high power level of received radio frequency energy and also showing the output of the diode detector in the absence of received radio frequency energy.

The circuit 10 includes a network 16, made up of diode detector 18 and biasing circuitry 20. The biasing network 20 includes resistors $R_3$, $R_4$ serially connected between a $-V$ voltage source and ground potential, as shown, to produce a bias voltage $-V_B$ across the diode detector 18 in the absence of received radio frequency energy. As is known, the voltage produced across the diode detector 18 will vary in accordance with the power of the received radio frequency energy, and will also vary with temperature variations in the diode detector 18 over a predetermined operating range of temperatures. The effect of variations on the output voltage across the diode detector 18 over the operating range of temperatures, for both the first, relatively high, and the second, relatively low, predetermined power levels $P_1$, $P_2$ of the received radio frequency energy is shown as curves 21 and 22, respectively, in FIG. 2. Also shown in FIG. 2, as curve 23, is the output voltage of the diode detector 18 as a function of temperature in the absence of received radio frequency energy. The resistance of resistor $R_3$ is selected so that the range of voltages produced by the diode detector 18 over the expected operating power range is within a predetermined voltage range, $V_{RANGE}$. The resistance of resistor $R_4$ is selected to provide a bias current, $I_B$, through the diode detector 18 so that the detector 18 operates in its linear operating region over the expected power level of the radio frequency energy (over the first, high, and second, low, predetermined power levels, $P_1$, $P_2$, respectively). Further, the bias current, $I_B$, through diode 18 produces across diode 18 at a nominal operating temperature, $T_0$ (FIG. 2) the bias voltage $-V_B$.

The output of the diode detector 18 is fed to an inverting input terminal 24 of a comparator 26. The non-inverting input terminal 25 of the comparator 26 is fed by a temperature compensated reference voltage $V_R$ which, as will be described hereinafter, provides a voltage level corresponding to the first, high, predetermined threshold voltage level, $-V_{T1}$, when the power in the level of the received radio frequency energy is initially received and the second, low (i.e. more negative) predetermined voltage level, $-V_{T2}$, after reception of the radio frequency energy having the high power level $P_1$. Thus, referring to FIGS. 3A and 3B, the reference voltage $V_R$ at input terminal 25 will have an initial voltage, $-V_{T1}$. That is, prior to the reception of radio frequency energy (FIG. 3A), the reference voltage $V_R$ at input terminal 25 will be the first predetermined voltage level $-V_{T1}$ (FIG. 3B) but after the received radio frequency energy level exceeds the first, high power level $P_1$ at time $T_1$ (i.e., when the voltage at the output of diode detector 18 becomes greater than $-V_{T1}$ at time $T_1$), the reference voltage $V_R$ at input terminal 25 will change to the voltage $-V_{T2}$. Once the power of the received radio frequency energy now falls below the low power level $P_2$ at time $T_3$ (i.e. when the voltage at the output of the diode detector 18 falls below $-V_{T2}$), the reference voltage $V_R$ at input terminal 25 returns to the voltage level $-V_{T1}$ (again corresponding to the high power level $P_1$).

In order to accurately control the threshold voltage level, the reference voltage, $V_R$, at input 25 of comparator 26 is temperature compensated by a temperature compensation network 28. Such network 28 includes a temperature sensitive device, here a thermistor 30. The thermistor 30 and diode detector 18 are disposed in a common, hermetically sealed package 32 so that the thermistor 30 is in thermal communication with the diode detector 18. Thus, temperature variations in the diode detector 18 will be thermally tracked by resistance changes in the thermistor 30. The temperature compensation network 28 also includes a voltage source $-V$ and resistors $R_N$, $R_1$ and $R_2$ arranged as shown. The values of these resistors $R_1$, $R_2$ and $R_N$ are selected so that the output voltage, $V_R$, produced by the temperature compensation network 28 on line 34 is the initial, or first, high predetermined threshold voltage $-V_{T1}$ at the temperature $T_0$ (FIG. 2); however, the voltage produced by the temperature compensation network 28 on line 34 will vary with the temperature to compensate for the temperature variations in the voltage produced across diode 18 as a result of such temperature variations in the manner shown in FIG. 2. More specifically, the resistor $R_1$, is selected to produce a voltage on line 34 equal to $-V_{T1}$ at the lowest expected operating temperature. The resistance of resistor $R_2$ is selected to produce a voltage on line 34 equal to $-V_{T1}$ at the highest expected operating temperature. The resistor $R_N$ is selected so that the range of voltages on line 34 over the operating range of temperatures is within the operating range of voltages, $V_{RANGE}$, produced by the diode detector 18. Thus, if the temperature of diode detector 18 increases above the temperature $T_0$, the voltage at terminal 24 increases in a positive sense; however, the increasing temperature effect on thermistor 30 is such that the resistance of thermistor 30 decreases, correspondingly also making the voltage on line 34 increase in a positive sense. Conversely, if the temperature of diode detector 18 decreases below the temperature $T_0$, the voltage at terminal 24 decreases in a positive sense; however, the decreasing temperature effect on thermistor 30 is such that the resistance of thermistor 30 increases, correspondingly making the voltage on line 34 decrease in a positive sense. The effect then is to maintain, as a function of temperature variations, a substantially constant operating voltage difference between terminals 24 and 25 as the temperature within the package 32 varies over the operating range of temperatures.

Figure 3A:
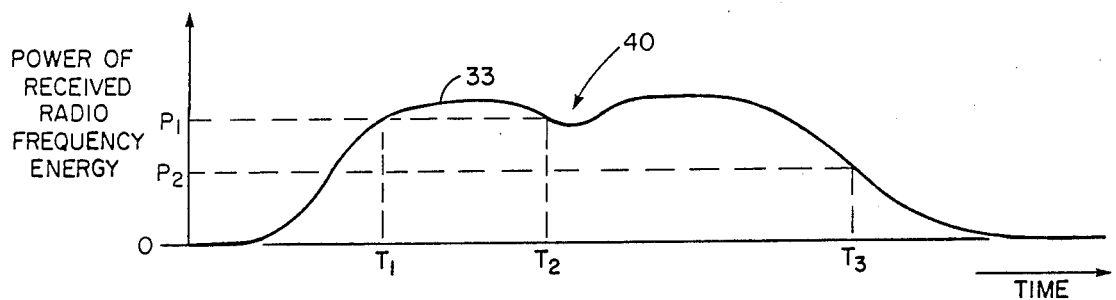
FIG. 3A is a curve showing the power history received radio frequency energy as a function of time.
Figure 3B:
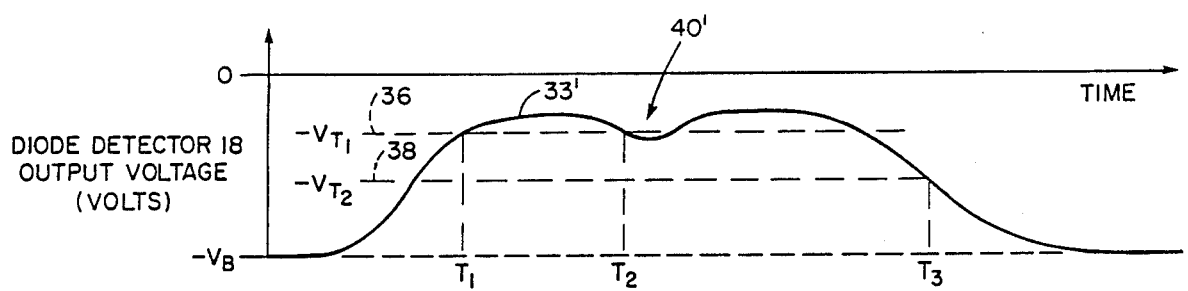
FIG. 3B is a time history of the voltage produced by the diode detector used in the circuitry of FIG. 1 in response to the power history of the received radio frequency energy of FIG. 3A.
Figure 3C:
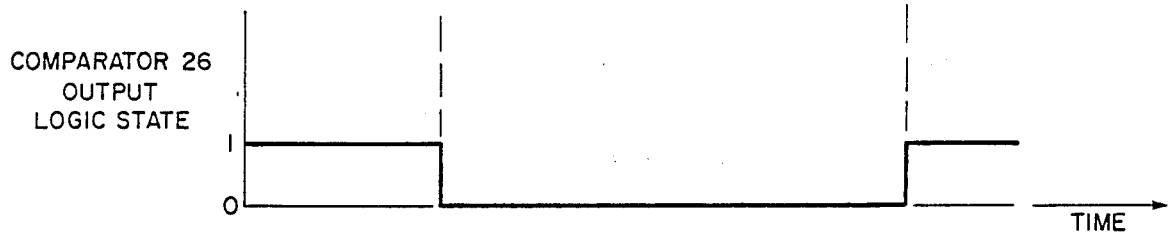
FIG. 3C is the time history showing of the logic state produced by a comparator used in the circuitry of FIG. 1 in response to the power history of received radio frequency energy shown in FIG. 3A.

Referring now again to FIGS. 3A and 3B, the power of the received radio frequency energy as a function of time for a typical time history of such energy is shown by the curve 33. The voltage produced by diode detector 18 in response to this received radio frequency energy is shown by curve 33'. A dotted line 36 corresponds to the first, or initial high threshold voltage level $-V_{T1}$ voltage. The dotted line 38 represents the second, low (i.e. more negative) predetermined threshold level, $-V_{T2}$. Thus, prior to time $T_1$, the voltage produced across diode detector 18 is below the initial threshold level $-V_{T1}$ and the output of comparator 26 at output terminal 12, therefore, at is a logic 1 or "high" positive voltage level (typically about 5 volts) as shown in FIG. 3C. At time $T_1$, the power of the received radio frequency signal exceeds the high power level $P_1$ and the voltage at the diode detector 18 increases above the temperature compensated reference voltage level $V_R$, such level now being at the first, initial high threshold voltage $-V_{T1}$. Thus, the voltage at terminal 24 becomes more positive than the reference voltage level at terminal 25, and hence the output of comparator 26 at terminal 12 changes from the "high" voltage or logic 1 state to the "low" voltage or logic 0 state. Thus, the voltage at terminal 12 is now a "low" voltage (typically about ground potential). This "low" voltage is coupled through resistor $R_5$ (which is serially connected between output terminal 12 and terminal 25, as shown) and $R_1$ to ground potential. Thus resistors $R_5$ and $R_1$ provide a conventional voltage divider. The resistance of resistor $R_5$ is selected so that the first, initial high threshold voltage $-V_{T1}$ is produced at terminal 12 when the comparator 12 produces a high voltage (i.e. about 5 volts) or logic 1 output signal and the second, low predetermined voltage level $-V_{T2}$ at terminal 12 when a low voltage (i.e. about ground potential) or logic 0 signal is produced at the output terminal 12 of comparator 26. To put it another way, when the output terminal 12 of comparator 26 is "high", or logic 1, the voltage fedback to terminal 25 from output terminal 12 via resistor $R_5$ is at a voltage level so that temperature compensation network 28 produces, as the temperature compensated reference voltage $V_R$, a negative voltage corresponding to voltage $-V_{T1}$ at terminal 25. When the output voltage of comparator 26 goes "low" the voltage fed to terminal 25 goes more negative, thereby increasing the magnitude of the reference voltage $V_R$ at terminal 25 (i.e. making the reference voltage $V_R$ more negative) so that the reference voltage $V_R$ becomes the voltage $V_{T2}$, as shown in FIG. 3B. Thus, when the output of comparator 26 indicates the initial detection of received radio frequency energy so that its output is now logic 0 or "low" as shown in FIG. 3C, the reference voltage $V_R$ at terminal 25 is changed from the level $-V_{T1}$ to the more negative threshold level voltage $-V_{T2}$, as shown by curve 38 in FIG. 3B. In this way, a momentary dip in the power level of the received radio frequency energy below the level $P_1$, as shown in region 40 of FIG. 3A, and region 40' in FIG. 3B will not inadvertently change this output state of the comparator 26 to produce a false indication that the received radio frequency energy terminated. That is, even though at time $T_2$ the power level of the received radio frequency energy falls below the initial level $P_1$ (corresponding to detector 18 threshold level $-V_{T1}$), the logic state of the output of comparator 26 does not revert back to a logic 1 state. When, however, the power level of the received radio frequency energy falls below the predetermined low level $P_2$, at time $T_3$, (corresponding to detector 18 second, low threshold level $-V_{T2}$), the output state of the comparator 26 reverts to the logic 1 state, as shown in FIGS. 3A, 3B and 3C. With such arrangement, because the output of the diode detector 18 is a function of temperature the reference voltage $V_R$, whether at this level $-V_{T1}$ or $-V_{T2}$, is compensated by the thermistor 30, an accurate threshold level signal is produced substantially independent of diode detector output level or operation temperature to thereby provide an accurate threshold voltage level reference from which is subtracted a voltage fed to it via the feedback resistor, $R_5$.

Having described a preferred embodiment of the invention, it will now be apparent to one of skill in the art that other embodiments incorporating its concepts may be used. It is felt, therefore, that this invention should not be restricted to the disclosed embodiment but rather should be limited only by the spirit and scope of the appended claims.

What is claimed is:

1. Radio frequency energy detection circuitry comprising:
    (a) means, including a diode detector having a first terminal fed by the received radio frequency energy and a second terminal connected to a reference potential, for producing an output voltage across the diode detector, such output voltage varying in accordance with the power of the received radio frequency energy, the voltage produced across the diode also varying with temperature variations over a predetermined operating range of temperatures;
    (b) means for producing a nominal threshold voltage including:
    temperature compensating circuitry means, disposed in thermal communication with the diode detector, for varying the nominal threshold voltage in accordance with the temperature produced variations in the voltage across the diode detector;
    (c) means, including:
        (i) a comparator having a pair of inputs and an output, a first one of the inputs being coupled to the diode detector;
        (ii) a feedback resistor, coupled between the output of the comparator and a second one of the pair of inputs of the comparator,
    for producing at the output of the comparator an output signal in one of two logic states, in an initial state in the absence of received radio frequency energy and for changing the initial state to a second state in response to the received radio frequency energy exceeding a first predetermined power level, the second state of the output signal being combined with the temperature compensated threshold level produced by the temperature compensating circuit to reduce the voltage at the second one of the pair of inputs of the comparator to a lower threshold voltage representative of a second, lower predetermined power level to prevent the second state of the output signal from reverting to the initial state until the power level of the received radio frequency energy falls below the second, lower predetermined power level.

2. The circuit recited in claim 1 wherein the temperature compensating circuitry means includes a resistance temperature sensitive device connected to a voltage divider circuit.

3. The circuit recited in claim 2 wherein the resistance temperature sensitive device is a thermistor.

4. The circuit of claim 2 wherein the resistance temperature sensitive device and the diode detector are disposed in a single package to provide the thermal communication between said resistance temperature sensitive device and said diode detector.

* * * * *